United States Patent
Galster et al.

(10) Patent No.: US 6,475,876 B2
(45) Date of Patent: Nov. 5, 2002

(54) PROCESS FOR FABRICATING A SEMICONDUCTOR COMPONENT

(75) Inventors: Norbert Galster, Rupperswil; Stefan Linder, Zofingen, both of (CH)

(73) Assignee: ABB Schweiz Holding AG, Baden (CH)

(*) Notice: Subject to any disclaimer, the term of this patent is extended or adjusted under 35 U.S.C. 154(b) by 0 days.

(21) Appl. No.: 09/374,844

(22) Filed: Aug. 16, 1999

(65) Prior Publication Data

US 2002/0045321 A1 Apr. 18, 2002

(30) Foreign Application Priority Data

Aug. 21, 1998 (DE) .......................................... 198 37 944

(51) Int. Cl.$^7$ ............................................. H01L 21/30
(52) U.S. Cl. ........................ 438/455; 438/543; 438/458
(58) Field of Search ................................. 438/381, 382, 438/383, 384, 455, 458, 456, 454; 357/38, 64, 22, 20, 55, 59, 531, 543; 143/33

(56) References Cited

U.S. PATENT DOCUMENTS

| | | | | |
|---|---|---|---|---|
| 3,967,294 A | * | 6/1976 | Takase et al. | 357/38 |
| 4,223,328 A | * | 9/1980 | Terasawa et al. | 357/22 |
| 4,520,075 A | | 5/1985 | Igarashi et al. | |
| 4,559,551 A | * | 12/1985 | Nakagawa | 357/38 |
| 4,594,602 A | * | 6/1986 | Iimura et al. | 357/13 |
| 4,656,493 A | * | 4/1987 | Adler et al. | 357/23.4 |
| 4,682,198 A | * | 7/1987 | Sakurada et al. | 357/38 |
| 4,684,413 A | * | 8/1987 | Goodman et al. | 437/17 |
| 4,692,345 A | * | 9/1987 | Nishiura et al. | 427/39 |
| 5,441,900 A | | 8/1995 | Bulucea et al. | |
| 5,882,987 A | * | 3/1999 | Srikrishnan | 438/455 |
| 5,966,620 A | * | 10/1999 | Sakaguchi et al. | 438/455 |
| 6,048,411 A | * | 4/2000 | Henley et al. | 148/33.5 |
| 6,054,370 A | * | 4/2000 | Doyle | 438/456 |
| 6,083,324 A | * | 7/2000 | Henley | 148/33.2 |
| 6,093,623 A | * | 7/2000 | Forbes | 438/455 |
| 6,146,979 A | * | 11/2000 | Henley et al. | 438/458 |
| 6,159,824 A | * | 12/2000 | Henley et al. | 438/455 |
| 6,225,192 B1 | * | 5/2001 | Aspar et al. | 438/460 |
| 6,242,324 B1 | * | 6/2001 | Kub et al. | 438/455 |
| 6,245,161 B1 | * | 6/2001 | Henley et al. | 148/33.4 |

FOREIGN PATENT DOCUMENTS

| | | | |
|---|---|---|---|
| DE | 39 13 123 A 1 | 10/1990 | |
| DE | 43 13 625 A 1 | 10/1993 | |
| DE | 43 10 444 A1 | 10/1994 | |
| DE | 44 10 354 A 1 | 10/1995 | |
| EP | 0 130 457 | 1/1985 | |
| EP | 0 419 898 | 4/1991 | |
| EP | 0 709 898 | 5/1996 | |
| JP | 59189679 | * 10/1984 | .............. 29/91 |
| JP | 359189679 | * 10/1984 | .............. 29/91 |
| JP | 3-95930 | 4/1991 | |
| JP | 5-102161 | 4/1993 | |
| JP | 9-246571 | 9/1997 | |
| JP | 09314330 | * 5/1999 | .............. 21/332 |

* cited by examiner

*Primary Examiner*—Olik Chaudhuri
*Assistant Examiner*—Laura M Schillinger
(74) *Attorney, Agent, or Firm*—Oblon, Spivak, McClelland, Maier & Neustadt, P.C.

(57) ABSTRACT

In a process for fabricating a semiconductor component, in particular a semiconductor diode, a semiconductor substrate (1) is provided with metal layers (3, 4) in order to form electrode terminals and with passivation (2), and is exposed to particle irradiation (P) in order to adjust the carrier lifetime. This being the case, at least the metal layer (3) on the irradiation side and the passivation (2) are not applied until after the particle irradiation (P). As a result, a continuous defect region (5), which precludes undesired edge effects, is obtained in the semiconductor substrate (1).

9 Claims, 2 Drawing Sheets

PROCESS FOR FABRICATING A SEMICONDUCTOR COMPONENT

BACKGROUND OF THE INVENTION

1. Field of the Invention

The present invention concerns the field of power electronics, in particular that of semiconductor diodes. It relates to a process for fabricating a semiconductor component according to the preamble of patent claim 1, and to a semiconductor component according to the preamble of patent claim 5.

2. Discussion of Background

One important parameter for the mode of operation of a semiconductor component is its axial carrier lifetime. This should, on the one hand, be as long as possible in order to keep the on-state losses small, but it should also be as short as possible in order to obtain a rapid blocking capability. For each semiconductor component, it is therefore necessary to find an optimum compromise in terms of its carrier lifetime. In order to achieve this, semiconductor components are provided with one or more defect regions or recombination regions, by means of which the carrier lifetime can be adjusted in a controlled way.

Generation of defects, and therefore adjustment of the axial carrier lifetime in semiconductor power components can basically be obtained in three ways: by irradiation with electrons, by doping with heavy metals, in particular with platinum or gold, or by particle irradiation with energetic heavy particles, in particular with hydrogen or helium nuclei.

Irradiation with electrons has the disadvantage that the semiconductor substrate is provided with defects throughout its volume, which does not permit an ideal compromise between the on-state behavior and the turn-off behavior of the semiconductor component. It is admittedly possible, by means of doping with heavy metals, to produce defects only in a predetermined region of the substrate. However, this process is elaborate and expensive.

One technique permitting controlled adjustment of the carrier lifetime which has now become established is particle irradiation with energetic heavy particles, protons or helium nuclei generally being used. Such a particle beam is directed at a surface of the semiconductor substrate, so that the particles penetrate into the substrate and produce defects there. The penetration depth of the particles depends in this case on their energy and the material composition of the matter to be penetrated. By selecting the particle energy, it is theoretically possible to determine the penetration depth in advance and therefore accurately adjust the position of the defect region. However, since semiconductor components do not generally have a homogeneous structure, the individual particles are exposed to different conditions.

This problem arises especially in the case of a semiconductor diode. Such a diode is represented in FIG. 1. Metal layers, which form an anode terminal 3 and a cathode terminal 4, are present on two opposite surfaces of a semiconductor substrate 1. The anode terminal 3 is in this case surrounded by passivation 2 in order to avoid edge effects, in particular charged interfacial states. Since the defect regions are intended to lie next to the anode 11, the irradiation must be carried out on the anode side. As can be seen in FIG. 1, a corresponding particle beam P therefore penetrates the metal layer 3 or the passivation 2, respectively, in order to enter the substrate 1. In this case, the metal layer and the passivation exert different breaking effects on the particles in the particle beam, so that the particles do not come to rest at the same depth. Instead, a defect region 5 is obtained which does not extend parallel to the surface on the anode side, but has a step 50 toward the edge. However, this nonuniform penetration depth of the particles, and the stepped defect region which results from this, impairs the functional capability of the diode. Since the edge is the most critical area of the diode, the effect of this shortcoming is made even greater.

Another disadvantage is that, when it penetrates the passivation, the particle beam produces defects in this area as well, in particular with covalent bonds being broken. Charged states are thus created both in the passivation and at the interface with the semiconductor, which reduce the maximum blocking capability of the diode.

SUMMARY OF THE INVENTION

Accordingly, one object of the invention is to provide a novel process for fabricating a semiconductor component, and a novel semiconductor component of the type mentioned at the start, which eliminate the disadvantages mentioned above.

This object is achieved by a process with the features of patent claim 1, and by a semiconductor component with the features of patent claim 5.

Other advantageous variants of the process and advantageous refinements can be found in the dependent patent claims.

According to the invention, in the fabrication process for the semiconductor component, the particle irradiation is carried out before the application of the metal layer and of the passivation. All the particles in the particle irradiation therefore encounter the same conditions, so that they penetrate to the same depth in the semiconductor substrate.

The process according to the invention makes it possible to fabricate a semiconductor component with a defect region that is continuous even in the edge areas. In this case, the position of the defects important for adjusting the carrier lifetime does not depend on the thickness and composition of the passivation and/or metallization. In addition, the passivation is protected from damage because it is not applied until after the particle irradiation.

The selection of suitable materials and suitable deposition techniques for the passivation and the metallization permits application at temperatures below 350° C. This ensures that the defect region's defects produced by the particle irradiation do not become depleted.

The process according to the invention is suitable for fabricating all semiconductor components in which the carrier lifetime needs to be adjusted very accurately. It is suitable, in particular, for fabricating diodes which are to be irradiated on the anode side.

BRIEF DESCRIPTION OF THE DRAWINGS

A more complete appreciation of the invention and many of the attendant advantages there are will be readily obtained as the same becomes better understood by reference to the following detailed description when considered in connection with the accompanying drawings which are not true to scale, wherein.

DESCRIPTION OF THE PREFERRED EMBODIMENTS

Figure 2A:
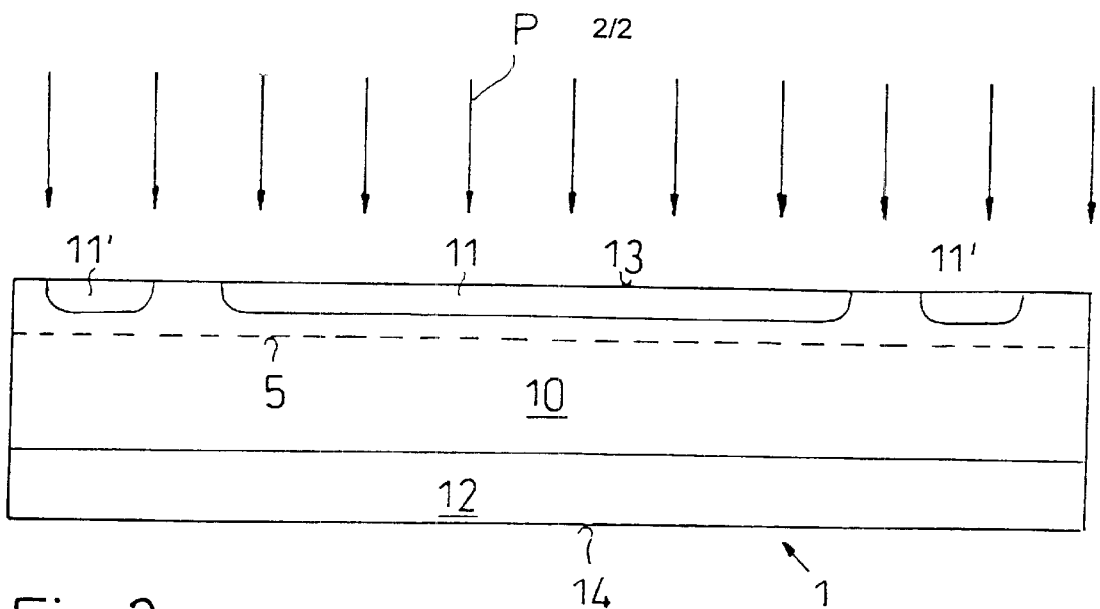
FIG. 2a shows a semiconductor component in a first production step of the process according to the invention.
Figure 2B:
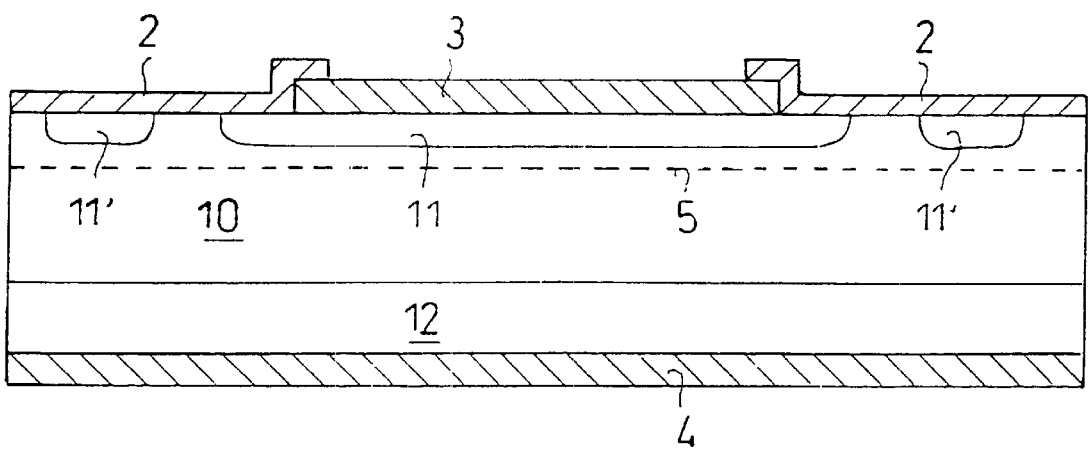
FIG. 2b shows the semiconductor component according to FIG. 2a in a second production step of the process according to the invention.

Referring now to the drawings, wherein like reference numerals designate identical or corresponding parts throughout the several views, FIGS. 2a and 2b show two production steps for a semiconductor diode using the process according to the invention. FIG. 2a represents the base element of a semiconductor diode, namely the semiconductor substrate 1. It preferably consists of silicon (Si), gallium arsenide (GaAs), silicon carbide (SiC), germanium (Ge) or silicon-germanium (SiGe). It has two parallel surfaces, one 13 on the anode side and one 14 on the cathode side. Essentially three regions are arranged between the surfaces 13, 14: a lightly doped $n^-$ region 10, a heavily doped p region 11 and a heavily doped $n^+$ region 12. The $n^-$ region 10 lies between the p and $n^+$ regions, while surrounding the p region and therefore extending as far as the anode-side surface 13 of the substrate 1. In the edge area of the substrate 1, there is a second p region in the form of a field ring 11'. There may, however, also be other common face edge terminations such as, for example, VLD (variation of lateral doping). These regions were obtained using known doping processes which will not be described at length here.

Figure 1:
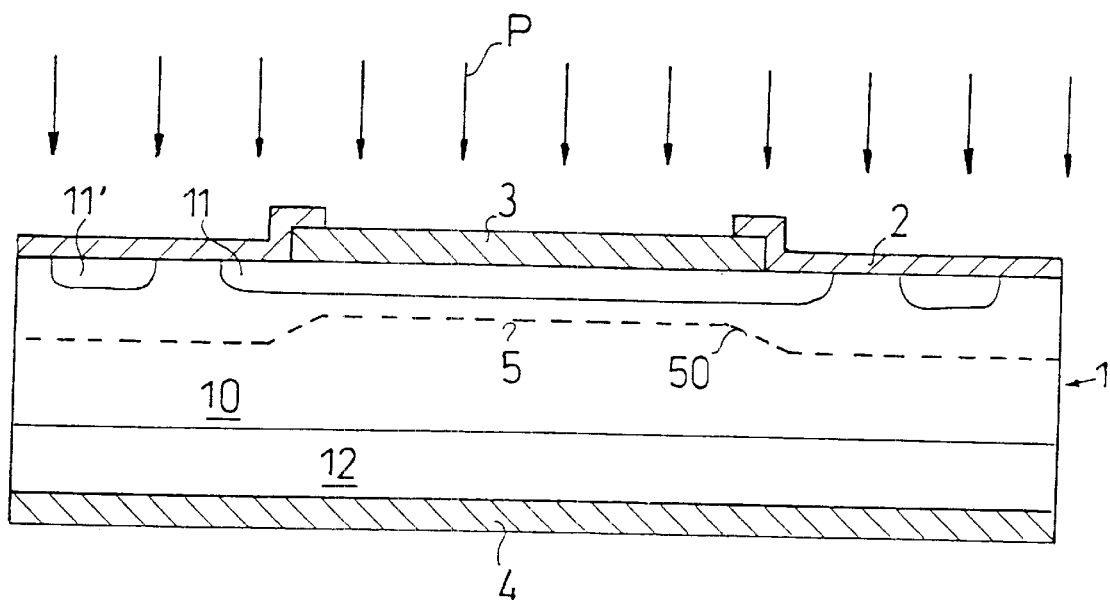
FIG. 1 shows a cross section through a semiconductor component which is produced using a process according to the prior art.
Figure 3:
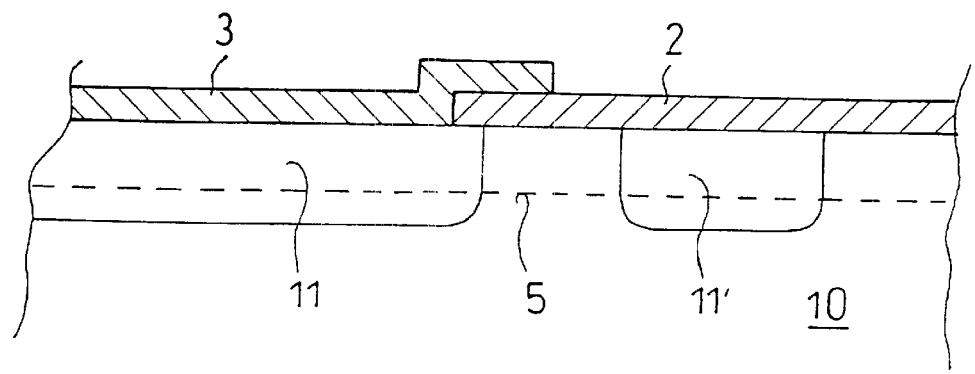
FIG. 3 shows a cross section through a part of a semiconductor component produced using the process according to the invention.

This semiconductor substrate 1 subdivided into doped regions is then exposed in a first process step to a particle beam P which acts on the substrate 1 on the p-region side, that is to say on the anode side. Helium nuclei are preferably used for this, although protons or other energetic, heavy particles may also be used. In this case, the entire anode-side surface 13 is irradiated as uniformly as possible. A defect region 5, which extends continuously and at least approximately parallel to the anode-side surface 13 of the substrate 1, is created in the semiconductor substrate 1. The position and width of the defect region 5 within the substrate 1 depend essentially on the energy of the particle beam and can therefore be adjusted very accurately, the optimum position depending on several factors. Depending on the nature and the intended purpose of the diode, it may be expedient, as represented in FIG. 2a, to position the defect region in such a way that, although it is next to the anode-side surface 13, it nevertheless lies exclusively in the $n^{31}$ region 10. In another case, optimum results may be obtained if the defect region 5 extends through the p region 11, as can be seen in FIG. 3.

After the particle irradiation, individual layers are then deposited on the substrate 1. The result of this procedure is represented in FIG. 2b. A first metal layer, which at least partially covers the p region 11, has been applied to the anode-side surface 13 of the substrate 1. This metal layer forms an anode terminal 3. Around this metal layer, passivation 2 which also covers the edge zones of the substrate surface has been deposited. On the opposite side, that is to say the cathode-side surface 14 of the substrate 1, a second metal layer which extends over the entire surface and forms a cathode terminal 4 has been deposited.

The two metal layers typically have a thickness of 3–20 μm. They are applied at a temperature below 350° C., so that the defect region formed by the particle irradiation, with its defects, does not become depleted. The material for the passivation is therefore selected accordingly, DLC (diamond-like carbon), amorphous silicon, doped or undoped glasses or polyimides preferably being used.

The sequence in which the layers are applied depends in turn on various factors, including their material compositions. In the example represented here, the metal layer 3 on the anode side is applied first, followed by the passivation 2, the passivation 2 partially overlapping the metal layer 3. In FIG. 3, the situation is quite the opposite, there being absolutely no relationship between the sequencing of the passivation and the metal layer and the optimum position of the defect region.

Further, the metal layer 4 on the cathode side can be deposited at various times. In a first variant of the process, it is applied after the particle irradiation and before, during or after the deposition of the metal layer 3 on the anode side. In another variant, the metal layer 4 on the cathode side is, however, deposited and sintered actually before the particle irradiation. This solution is advantageous when the contact between the metal layer on the cathode side and the semiconductor substrate is not good enough and a temperature above 350° C. is therefore required when applying, in particular when sintering, the metal layer. This is the case, for example, with low-level n-type doping of the cathode.

Obviously, numerous modifications and variations of the present invention are possible in light of the above teachings. It is therefore to be understood that within the scope of the appended claims, the invention may be practiced otherwise than as specifically described herein.

What is claimed is:

1. A process for fabricating a semiconductor component that retains a defect region that adjusts carrier lifetime, the process comprising:

providing a semiconductor substrate having first and second surfaces;

doping the semiconductor substrate to form doped regions of opposite polarities;

after the doped regions have been formed, adjusting carrier lifetime by exposing the first surface of the semiconductor substrate to particle irradiation with one of a group consisting of hydrogen nuclei or helium nuclei, to produce the defect region so that the defect region extends into the substrate continuously and at least approximately parallel to at least one of the first and second surfaces;

providing first and second metal layers on respective of the first and second surfaces of the semiconductor substrate, respectively, so as to form respective first and second electrode terminals, the providing of the first metal layer on the first surface being performed after the particle irradiation exposing step; and providing the semiconductor substrate with a passivation on the first surface, after the particle irradiation exposing step.

2. The process of claim 1, wherein the step of providing the second metal layer on the second surface of the semiconductor substrate is performed before the particle irradiation exposing step.

3. The process of claim 1, wherein the steps of providing the first and second metal layers are both performed after the particle irradiation exposing step.

4. The process of claim 1, wherein the passivation providing step is carried out at a temperature below 350° C.

5. The process of claim 1, wherein:
the step of providing the first metal layer constitutes forming an anode as the first electrode terminal on the first surface of the semiconductor substrate; and
the particle irradiation exposing step is performed on the first surface of the semiconductor substrate so that the defect region is parallel to the first surface of the semiconductor substrate.

6. The process of claim 1, wherein:
the step of providing the first metal layer constitutes forming an anode as the first electrode terminal on the first surface of the semiconductor substrate; and
the particle irradiation exposing step is performed on the first surface of the semiconductor substrate.

7. The process of claim 1, wherein the passivation includes one of the group consisting of diamond-like carbon, amorphous silicon, a glass, or a polyimide.

8. The process of claim 1, wherein the semiconductor component is a semiconductor diode.

9. The component produced according to the process of claim 1.

* * * * *

UNITED STATES PATENT AND TRADEMARK OFFICE
CERTIFICATE OF CORRECTION

PATENT NO.    : 6,475,876 B2                                             Page 1 of 1
DATED         : November 5, 2002
INVENTOR(S)   : Galster et al.

It is certified that error appears in the above-identified patent and that said Letters Patent is hereby corrected as shown below:

<u>Title page,</u>
Item [45] and the Notice information should read as follows:
-- [45]  **Date of Patent: \*Nov. 5, 2002**
(\*) Notice: This patent issued on a continued prosecution application filed under 37 CFR 1.53(d), and is subject to the twenty year patent term provisions of 35 U.S.C. 154 (a)(2)

Subject to any disclaimer, the term of this patent is extended or adjusted under 35 U.S.C. 154(b) by 0 days. --

Signed and Sealed this

Fifteenth Day of April, 2003

JAMES E. ROGAN
*Director of the United States Patent and Trademark Office*